(12) United States Patent
Chen et al.

(10) Patent No.: US 12,205,854 B2
(45) Date of Patent: Jan. 21, 2025

(54) ELECTRONIC DEVICE

(71) Applicant: InnoLux Corporation, Miao-Li County (TW)

(72) Inventors: Yeong-E Chen, Miao-Li County (TW); Kuang-Chiang Huang, Miao-Li County (TW); Yu-Ting Liu, Miao-Li County (TW); Yi-Hung Lin, Miao-Li County (TW); Cheng-En Cheng, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/369,847

(22) Filed: Sep. 19, 2023

(65) Prior Publication Data

US 2024/0006249 A1 Jan. 4, 2024

Related U.S. Application Data

(63) Continuation of application No. 17/315,389, filed on May 10, 2021, now Pat. No. 11,798,853.

(30) Foreign Application Priority Data

Nov. 26, 2020 (CN) .......................... 202011353826.8

(51) Int. Cl.
*H01L 21/66* (2006.01)
*H01L 21/48* (2006.01)
*H01L 23/00* (2006.01)

(52) U.S. Cl.
CPC .............. *H01L 22/14* (2013.01); *H01L 21/48* (2013.01); *H01L 22/32* (2013.01); *H01L 24/19* (2013.01); *H01L 24/82* (2013.01); *H01L 2224/829* (2013.01)

(58) Field of Classification Search
None
See application file for complete search history.

(56) References Cited

U.S. PATENT DOCUMENTS

2015/0145108 A1* 5/2015 Yap .......................... H01L 23/66
257/664
2020/0185346 A1* 6/2020 Venkatadri ........ H01L 23/49816

* cited by examiner

*Primary Examiner* — Alexander G Ghyka
(74) *Attorney, Agent, or Firm* — Winston Hsu

(57) ABSTRACT

The present disclosure provides an electronic device including a redistribution layer, a plurality of passive components, and an electronic component. The redistribution layer includes a first insulating layer, a second insulating layer, and a plurality of traces electrically connected to each other through a first opening of the first insulating layer and a second opening of the second insulating layer, wherein the first insulating layer has a first side away from the second insulating layer, and the second insulating layer has a second side away from the first insulating layer. The passive components are disposed on the first side. The electronic component is disposed on the second side. The plurality of passive components are electrically connected to the electronic component through the plurality of traces.

6 Claims, 9 Drawing Sheets

ELECTRONIC DEVICE

CROSS REFERENCE TO RELATED APPLICATIONS

This application is a continuation application of U.S. application Ser. No. 17/315,389, filed on May 10, 2021. The content of the application is incorporated herein by reference.

BACKGROUND OF THE DISCLOSURE

1. Field of the Disclosure

The present disclosure relates to an electronic device.

2. Description of the Prior Art

In package technologies, a redistribution layer may be fabricated on a large-sized substrate, and packaging process and cutting process are performed to fabricate a large number of package devices at the same time. However, in the current package technologies, there is no monitoring manner that can inspect and judge the process of the redistribution layer or the quality of the devices in real time. Usually, after the chips are bonded on the redistribution layer, the circuits of the redistribution layer are inspected whether it has a short circuit or an open circuit. In this way, when defects were found in the circuit inspection of the redistribution layer, the chips that have been bonded on the redistribution layer cannot be reused, thus resulting in waste of manufacturing cost.

SUMMARY OF THE DISCLOSURE

An embodiment of the present disclosure provides an electronic device including a redistribution layer, a plurality of passive components, and an electronic component. The redistribution layer includes a first insulating layer, a second insulating layer, and a plurality of traces electrically connected to each other through a first opening of the first insulating layer and a second opening of the second insulating layer, wherein the first insulating layer has a first side away from the second insulating layer, and the second insulating layer has a second side away from the first insulating layer. The passive components are disposed on the first side. The electronic component is disposed on the second side. The plurality of passive components are electrically connected to the electronic component through the plurality of traces.

These and other objectives of the present disclosure will no doubt become obvious to those of ordinary skill in the art after reading the following detailed description of the embodiment that is illustrated in the various figures and drawings.

DETAILED DESCRIPTION

Figure 1:
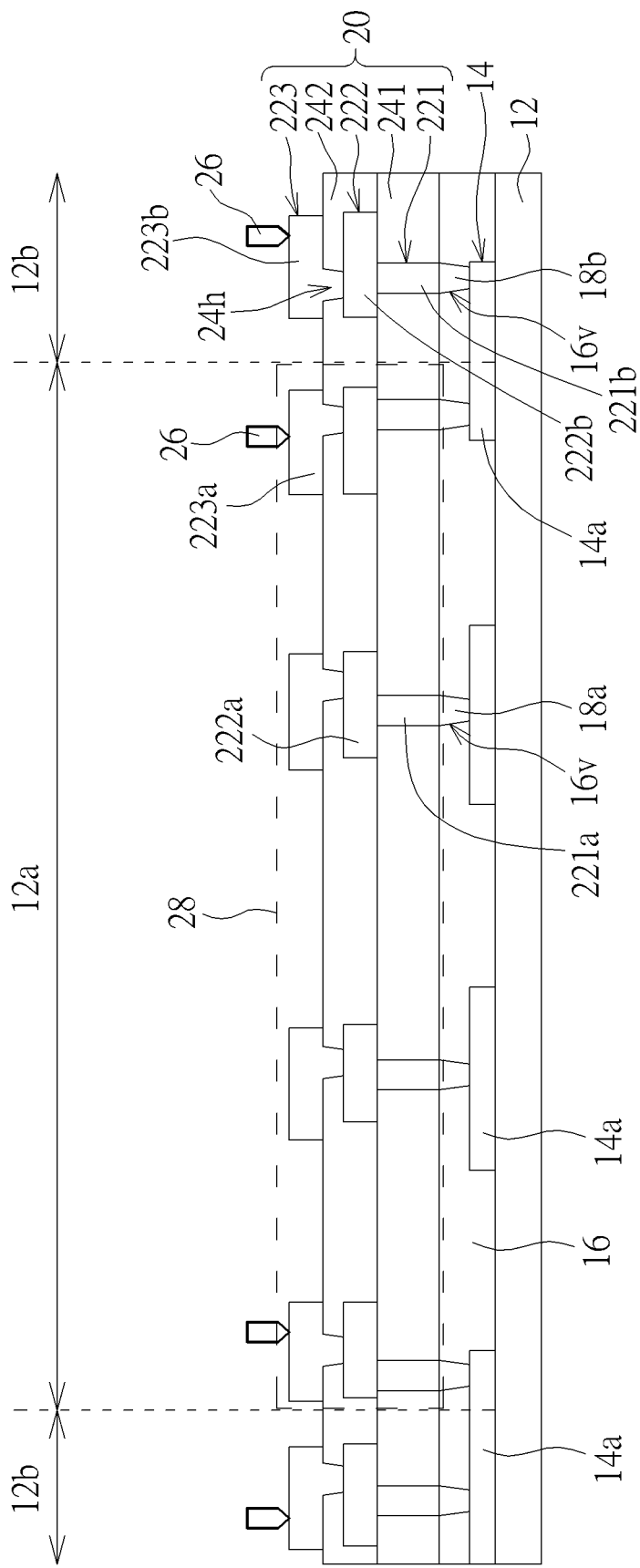
FIG. 1 is a schematic diagram illustrating a manufacturing method of a package device according to some embodiments of the present disclosure.

The contents of the present disclosure will be described in detail with reference to specific embodiments and drawings. It is noted that, for purposes of illustrative clarity and being easily understood by the readers, the following drawings may be simplified schematic diagrams, and components therein may not be drawn to scale. The numbers and dimensions of the components in the drawings are just illustrative, and are not intended to limit the scope of the present disclosure.

Certain terms are used throughout the specification and the appended claims of the present disclosure to refer to specific components. Those skilled in the art should understand that electronic equipment manufacturers may refer to a component by different names, and this document does not intend to distinguish between components that differ in name but not function. In the following description and claims, the terms "comprise", "include" and "have" are open-ended fashion, so they should be interpreted as "including but not limited to . . . ".

Furthermore, the terms "coupled to" and "electrically connected to" here include any directly and indirectly connecting means. Therefore, if it is described in this document that a first component is coupled or electrically connected to a second component, it means that the first component may be directly connected to the second component, or may be indirectly connected to the second component through other components or other connecting means.

In some embodiments of the present disclosure, terms regarding bonding and connection, such as "connection", "interconnection", etc., unless specifically defined, may mean that two structures are in direct contact, or it may also mean that two structures are not in direct contact, where other structures are disposed between these two structures. The terms regarding bonding and connection may also include the cases where both structures are movable or both structures are fixed.

It should be understood that the components or devices in the drawings may be disposed in various forms which are known to those skilled in the art. In addition, spatially relative terms, such as "below", "lower", "bottom", "upper", "higher", or "top", may be used in the embodiments to describe one component's relationship to another component as illustrated in the drawings. It is understandable that if the device in the drawings is turned over to make it upside down, the components described on the "lower" side would then become components on the "higher" side. The embodiments of the present disclosure can be understood with reference to the drawings, and the drawings of the present disclosure are also regarded as a part of the disclosed description. It should be understood that the drawings of the present disclosure may not be drawn to scale. In fact, the dimensions of the components may be arbitrarily increased or reduced for clarity of the features of the present disclosure. Furthermore, when it is mentioned that a first material layer is disposed on or above a second material layer, it includes the cases where the first material layer is in direct contact with the second material layer, or there may be one or more other material layers disposed between the first material layer and the second material layer. In this case, the first material layer may not be in direct contact with the second material layer.

In addition, it should be understood that although the terms "first", "second", "third", etc. may be used herein to describe various elements, components, or portions, these elements, components or portions should not be limited by these terms. These terms may be only used to distinguish different elements, components, regions, layers or portions. Thus, a first element, component, region, layer or portion discussed below could be termed a second element, component, region, layer or portion without departing from the present disclosure.

It should be understood that according to the following embodiments, features of different embodiments may be replaced, recombined or mixed to constitute other embodiments without departing from the spirit of the present disclosure.

Figure 3:
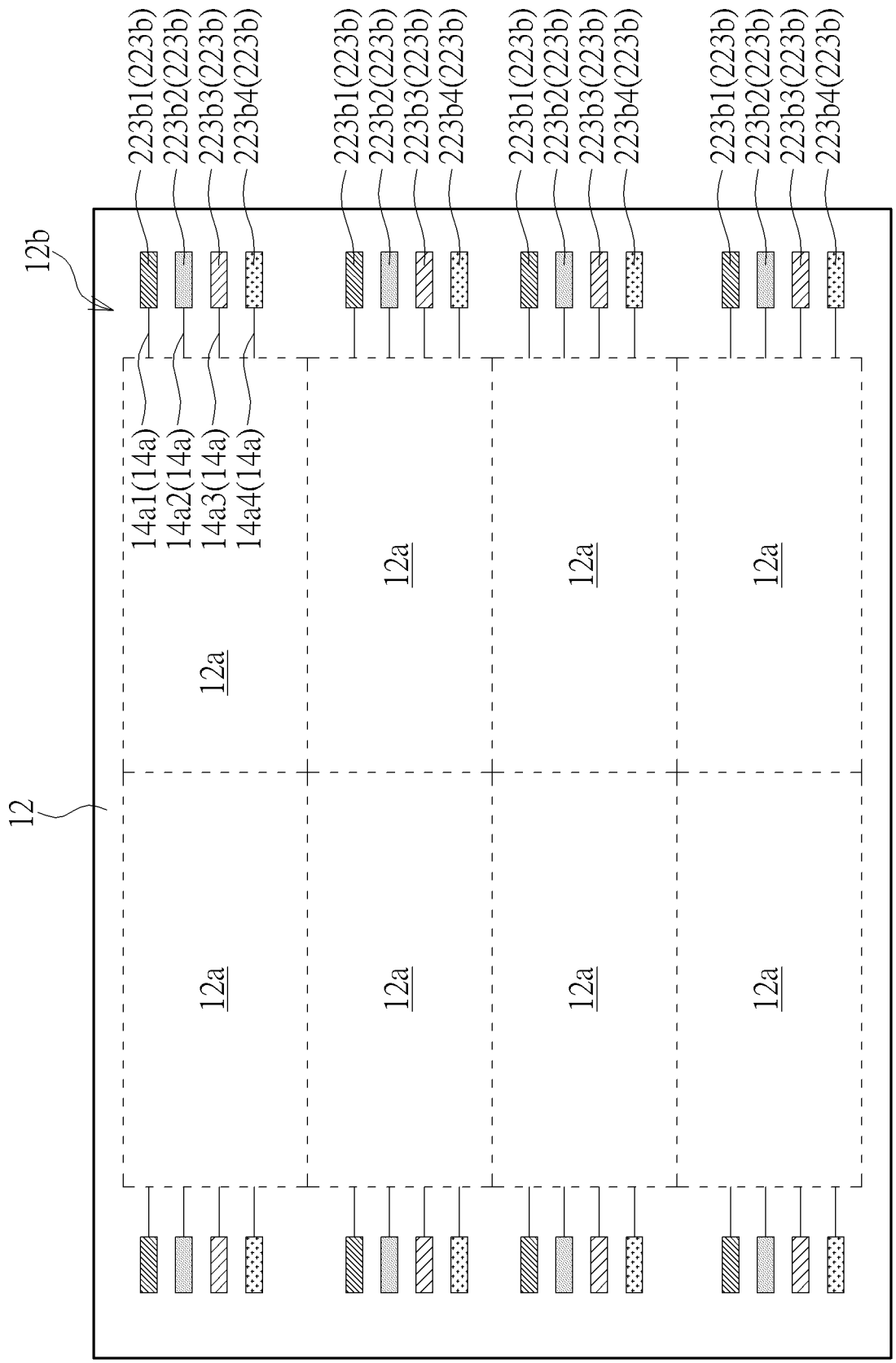
FIG. 3 is a schematic top view of a package device before a cutting process is performed according to some embodiments of the present disclosure.

FIG. 1 is a schematic diagram illustrating a manufacturing method of a package device according to some embodiments of the present disclosure, and showing the structure of a package device 28 in a cross-sectional view. The manufacturing method of the package device 28 according to one embodiment of the present disclosure includes the following steps. The manufacturing method of the present disclosure may use, for example, a fan-out panel level package (FOPLP) or fan-out wafer level package (FOWLP) technology. The followings are described with FOPLP technology as an example, but not limited thereto. Moreover, the manufacturing methods of the present disclosure are not limited to the following steps, and any other step may be performed before, after, or between the steps illustrated herein. As shown in FIG. 1, the manufacturing method of the package device 28 of the present disclosure may include providing a carrier substrate 12, at least one first conductive layer 14 and a release layer 16. In this embodiment, first, the carrier substrate 12 may be provided, and then at least one first conductive layer 14 and the release layer 16 are formed on the carrier substrate 12. The carrier substrate 12 may be used to carry the components formed thereon during the process of manufacturing the package device 28. The carrier substrate 12 may be, for example, a rigid substrate or a flexible substrate disposed on a rigid carrier. The carrier substrate 12 may include, for example, glass, polyimide (PI), polyethylene terephthalate (PET) or other suitable materials. In the embodiment of FIG. 1, the carrier substrate 12 may have at least one device region 12a and a peripheral region 12b, where the device region 12a may be used as a region for forming the package device 28, and the peripheral region 12b may be used as a region for disposing the pads for inspecting the package device or other components that are not in the package device 28. The peripheral region 12b may be disposed on at least one side of the device region 12a. For example, as shown in FIG. 3, the peripheral region 12b may surround the device region 12a, but not limited thereto.

In the embodiment of FIG. 1, the first conductive layer 14 may be formed on the carrier substrate 12 before the release layer 16 is formed, and thus the first conductive layer 14 may be disposed between the release layer 16 and the carrier substrate 12. The first conductive layer 14 may include at least one inspection line 14a, where the inspection line 14a may extend from the device region 12a to the peripheral region 12b, so that the devices formed in the device region 12a may be inspected through the inspection line 14a in the subsequent manufacturing processes. In the embodiment of FIG. 1, the number of inspection lines may be multiple, but not limited thereto. In some embodiments, the material of the first conductive layer 14 may include silver, copper, aluminum, molybdenum, tungsten, gold, chromium, nickel, platinum, titanium, iridium, rhodium, indium, bismuth, alloys thereof, combinations thereof, or other metal materials with good conductivity, but not limited thereto. In some embodiments, the first conductive layer 14 may be, for example, an integrated passive device layer or a seed layer. For example, the first conductive layer 14 may also include passive components, such as capacitors, inductors, resistors, other suitable components, or a combination of at least two of the above, but not limited thereto. The inspection line 14a may be, for example, mesh-shaped, linear, or other suitable shapes, but not limited thereto.

As shown in FIG. 1, then, the release layer 16 may be disposed on the first conductive layer 14 and the carrier substrate 12, where the release layer 16 may extend from the device region 12a to the peripheral region 12b. For example, the release layer 16 may include a photo-release material or a thermal-release material, but not limited thereto. The material of the release layer 16 may include parylene, organic silicone resin or silicone oil, but not limited thereto. After the release layer 16 is provided, a plurality of through holes 16v may be formed in the release layer 16, and a contact structure may be formed in each of the through holes 16v, thereby forming a plurality of contact structures penetrating the release layer 16. The contact structures may be electrically connected to the corresponding inspection lines 14a. For example, the contact structures may include a contact structure 18a in the device region 12a and a contact structure 18b in the peripheral region 12b. The contact structure 18a and the corresponding contact structure 18b may be connected to two ends of the same inspection line 14a respectively, so that the circuits in the device region 12a may be electrically connected to the contact structure 18b in the peripheral region 12b through the inspection line 14a. The contact structure 18a and the contact structure 18b may include conductive materials, such as silver, copper, aluminum, molybdenum, tungsten, gold, chromium, nickel, platinum, titanium, iridium, rhodium, indium, bismuth, alloys thereof, combinations thereof, or other metal materials with good conductivity, but not limited thereto. Therefore, the contact structure 18a and the contact structure 18b may be used for electrical connection with the subsequently formed devices.

As shown in FIG. 1, after the contact structures are formed, a redistribution layer 20 may be formed on the release layer 16 and the contact structures. The redistribution layer 20 may be electrically connected to the first conductive layer 14 through the contact structure 18a and the contact structure 18b. The redistribution layer 20 may include a plurality of second conductive layers (such as a second conductive layer 221, a second conductive layer 222, and a second conductive layer 223) and multiple dielectric layers (such as a dielectric layer 241 and a dielectric layer 242). One of the dielectric layers between two adjacent second conductive layers may have a plurality of openings 24h, so that the traces or the pads formed of the two adjacent second conductive layers may be electrically connected to each other through the openings 24h. In one embodiment, the second conductive layers may include silver, copper, aluminum, molybdenum, tungsten, gold, chromium, nickel, platinum, titanium, iridium, rhodium, indium, bismuth, alloys thereof, combinations thereof or other metal materials with good conductivity, but not limited thereto. It should be noted that an inspection step may be performed during the process of forming the redistribution layer 20 to inspect the circuit formed of at least one layer of the second conductive layers.

The manufacturing method of the redistribution layer 20 with the inspection step will be described in detail below, but it is not limited thereto. Please still refer to FIG. 1, after the contact structures are formed, the second conductive layer 221 may be formed on the release layer 16. In the embodiment shown in FIG. 1, the second conductive layer 221 may be formed on the contact structures, and the second conductive layer 221 may include a plurality of conductive pillars (such as a conductive pillar 221a and a conductive pillar 221b), where the conductive pillars may be electrically connected to the corresponding contact structures respectively. For example, the conductive pillar 221a in the device region 12a may be electrically connected to the contact structure 18a in the device region 12a, and the conductive pillar 221b in the peripheral region 12b may be electrically connected to the contact structure 18b in the peripheral region 12b. Subsequently, the dielectric layer 241 is formed on the release layer 16 around the conductive pillar 221a and the conductive pillar 221b. In one embodiment, the upper surface portion of the dielectric layer 241 may be removed, for example, by polishing until the conductive pillar 221a and the conductive pillar 221b are exposed, but not limited thereto. In some embodiments, when the upper surface of the dielectric layer 241 is higher than the upper surface of the conductive pillar 221a, the conductive pillar 221a and the conductive pillar 221b may still be exposed by forming openings in the dielectric layer 241.

As shown in FIG. 1, thereafter, the second conductive layer 222 is formed on the dielectric layer 241 that is formed on the release layer 16. The second conductive layer 222 may include, for example, at least one pad 222a and at least one pad 222b, where the pad 222a may be disposed in the device region 12a and electrically connected to the corresponding conductive pillar 221a, and the pad 222b may be disposed in the peripheral region 12b and electrically connected to the corresponding conductive pillar 221b. Then, the dielectric layer 242 is formed on the second conductive layer 222 and the dielectric layer 241, and the openings 24h are formed in the dielectric layer 242 to expose the corresponding pad 222a and the corresponding pad 222b, respectively. In the embodiment of FIG. 1, the number of the pads 222a and the number of the pads 222b may be multiple, but not limited thereto. In some embodiments, the second conductive layer 222 may also include at least one trace (not shown) according to requirements, which is disposed in the device region 12a and used to laterally and electrically connect the corresponding pad 222a or pad 222b to the pads formed in the subsequent steps. In one embodiment, the second conductive layer 221 and the second conductive layer 222 may be formed separately or together (formed of the same conductive layer), but not limited thereto. In one embodiment, the contact structures, and the second conductive layer 221 may be formed separately or together (formed of the same conductive layer), but not limited thereto. In one embodiment, the contact structures, the second conductive layer 221, and the second conductive layer 222 may be formed separately, or together (formed of the same conductive layer), but not limited thereto. It should be noted that the inspection step may be performed in real time in the process of forming the redistribution layer 20. For example, input/output terminals 26 may be used to perform inspection on the circuit formed of at least one layer of the second conductive layers through the pad 222a and the pad 222b.

Subsequently, the second conductive layer 223 is formed on the dielectric layer 242 to form the redistribution layer 20 of the package device 28. The second conductive layer 223 may include at least one pad 223a and at least one pad 223b, and the pad 223a may be electrically connected to the pad 223b through the first conductive layer 14. The pad 223a may be electrically connected to the first conductive layer 14 through the contact structure 221a, and the pad 223b may be electrically connected to the first conductive layer 14 through the contact structure 221b. In the embodiment of FIG. 1, the number of the pads 223a and the number of the pads 223b may be multiple, but not limited thereto. As shown in FIG. 1, after the second conductive layer 223 is formed, an inspection step may be performed to inspect whether the circuits formed of the second conductive layer 221, the second conductive layer 222, and the second conductive layer 223 have short-circuit or open-circuit problems. In the inspection step shown in FIG. 1, the pad 223b may be used as an inspection pad, one of the input/output terminals 26 may be used to provide an input signal to one of the pad 223b and the exposed pad 223a, and another of the input/output terminals 26 may be used to receive an output signal from another of the pad 223b and the pad 223a. Through the received output signal, it may be determined whether the line connected between the pad 223b and the pad 223a is conductive. The input/output terminal 26 may input signals or receive signals through a contact-type or noncontact-type manner. For a contact-type manner, the input/output terminals 26 may include a contact-type detector, such as a probe, and the input/output terminals 26 may be in direct contact with the pad 223b and the pad 223a, respectively, but not limited thereto. For a noncontact-type manner, the input/output terminals 26 may receive signals in a noncontact-type manner, for example, through being separated from the pad 223a by a certain distance to receive the electric field signal generated from the pad 223a. In this case, the input/output terminals 26 for receiving the output signal may include, for example, an electric field sensor, but not limited thereto. In some embodiments, after the inspection step is performed on the second conductive layer 223, a cutting process may be optionally performed to separate the redistribution layer 20 in the device region 12a and the peripheral region 12b, and a release process may be performed to separate the redistribution layer 20 from the release layer 16. Therefore, the redistribution layer 20 in the peripheral region 12b may be removed, and the release layer 16 and the carrier substrate 12 and the first conductive layer 14 under it may also be removed. As a result, the redistribution layer 20 in the device region 12a may form the package device 28, but not limited thereto.

In some embodiments, another inspection step may be performed between the steps of forming the second conductive layer 221 and forming the dielectric layer 241 or between the steps of forming the dielectric layer 241 and forming the second conductive layer 222, so as to inspect the quality of the formed second conductive layer 221. In some embodiments, another inspection step may be performed between the steps of forming the second conductive layer 222 and forming the dielectric layer 242, or between the steps of forming the dielectric layer 242 and forming the second conductive layer 223, so as to inspect the quality of the formed second conductive layer 222. When the inspection step is performed between the steps of forming the dielectric layer 242 and forming the second conductive layer 223, the input/output terminals 26 may provide input signals to or receive output signals from the corresponding pad 222a and/or the pad 222b through the openings 24h in the dielectric layer 242.

Figure 2:
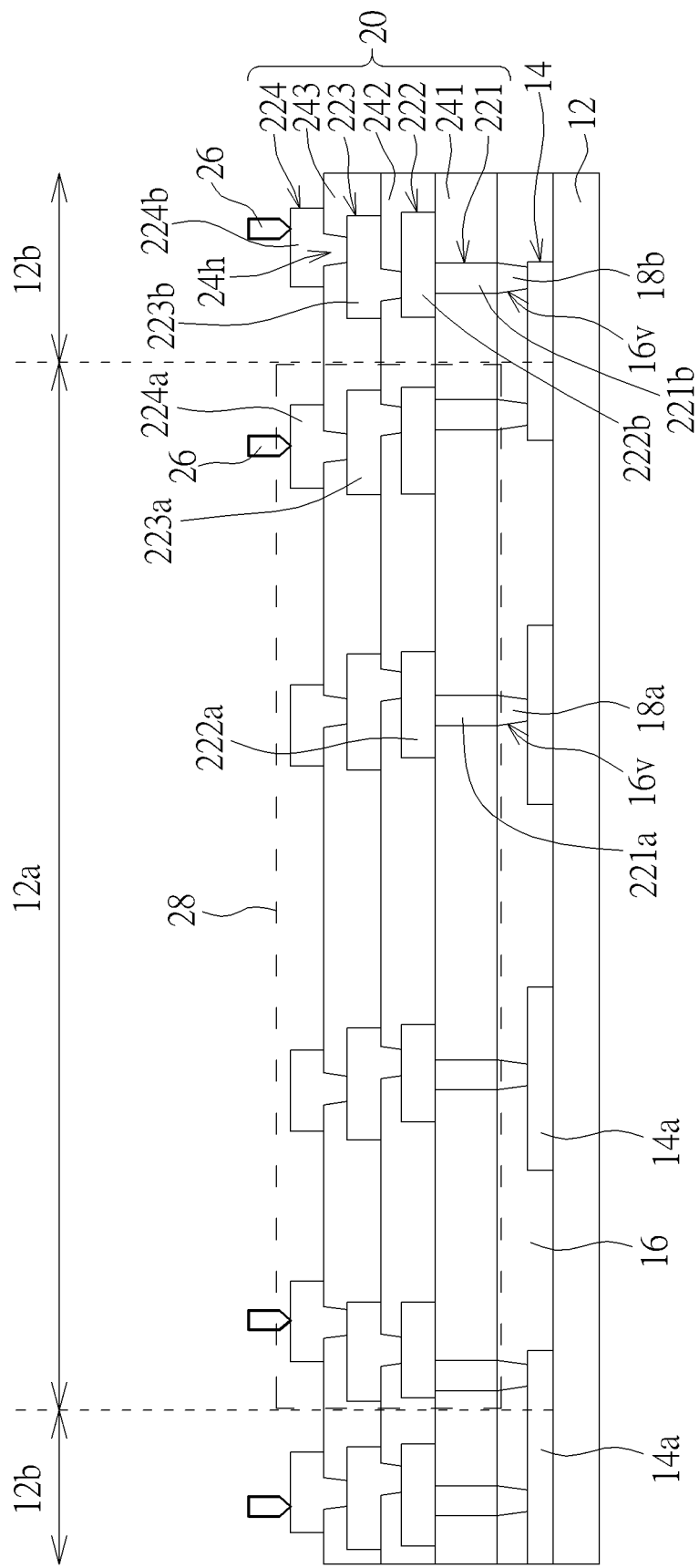
FIG. 2 is a schematic diagram illustrating a manufacturing method of a package device according to some embodiments of the present disclosure.

FIG. 2 is a schematic diagram illustrating a manufacturing method of a package device according to some embodiments of the present disclosure. As shown in FIG. 2, after the inspection step of the second conductive layer 223 shown in FIG. 1, at least one dielectric layer 243 may be optionally formed on the second conductive layer 223 and the dielectric layer 242, and openings 24h are formed in the dielectric layer 243 to expose the corresponding pad 223a and the corresponding pad 223b. Next, at least one second conductive layer 224 is formed on the dielectric layer 243 to form the redistribution layer 20. The second conductive layer 224 may include at least one pad 224a in the device region 12a and at least one pad 224b in the peripheral region 12b. In the embodiment of FIG. 2, the number of the pads 224a and the number of the pads 224b may be multiple, but not limited thereto. In some embodiments, after the second conductive layer 224 is formed, at least another inspection step may be performed to provide an input signal to one of the pad 224b and the exposed pad 224a, and to receive an output signal from another of the pad 224b and the pad 224a to inspect the quality of the formed second conductive layer 224, thereby checking whether the alignment relationship between the second conductive layer 224 and the underlying second conductive layer 223 meets the standard, and confirming whether the circuit between the pad 224a and the pad 224b has a short-circuit or open-circuit problem.

In some embodiments, as shown in FIG. 2, after the inspection step of the second conductive layer 224, a cutting process may be performed to separate the redistribution layer 20 in the device region 12a and the peripheral region 12b. In addition, a release process is performed to separate the redistribution layer 20 from the release layer 16. Therefore, the redistribution layer 20 in the peripheral region 12b is removed, and the release layer 16 and the carrier substrate 12 and the first conductive layer 14 under it are also removed. As a result, the redistribution layer 20 in the device region 12a may form the package device 28. In some embodiments, the order of the cutting process and the release process may be interchanged with each other. In some embodiments, since a portion of the contact structure 18a will remain on the lower surface of the conductive pillar 221a in the release process, the finally formed package device 28 may have a downwardly protruding structure on the lower surface of the conductive pillar 221a, but not limited thereto. In some embodiments, the manufacturing method of the package device may further include disposing electronic components, such as chips, on the redistribution layer 20, and forming an encapsulation gel around the electronic components before the cutting process and the release process, so that the formed package device may include the electronic components, but not limited thereto.

Figure 4:
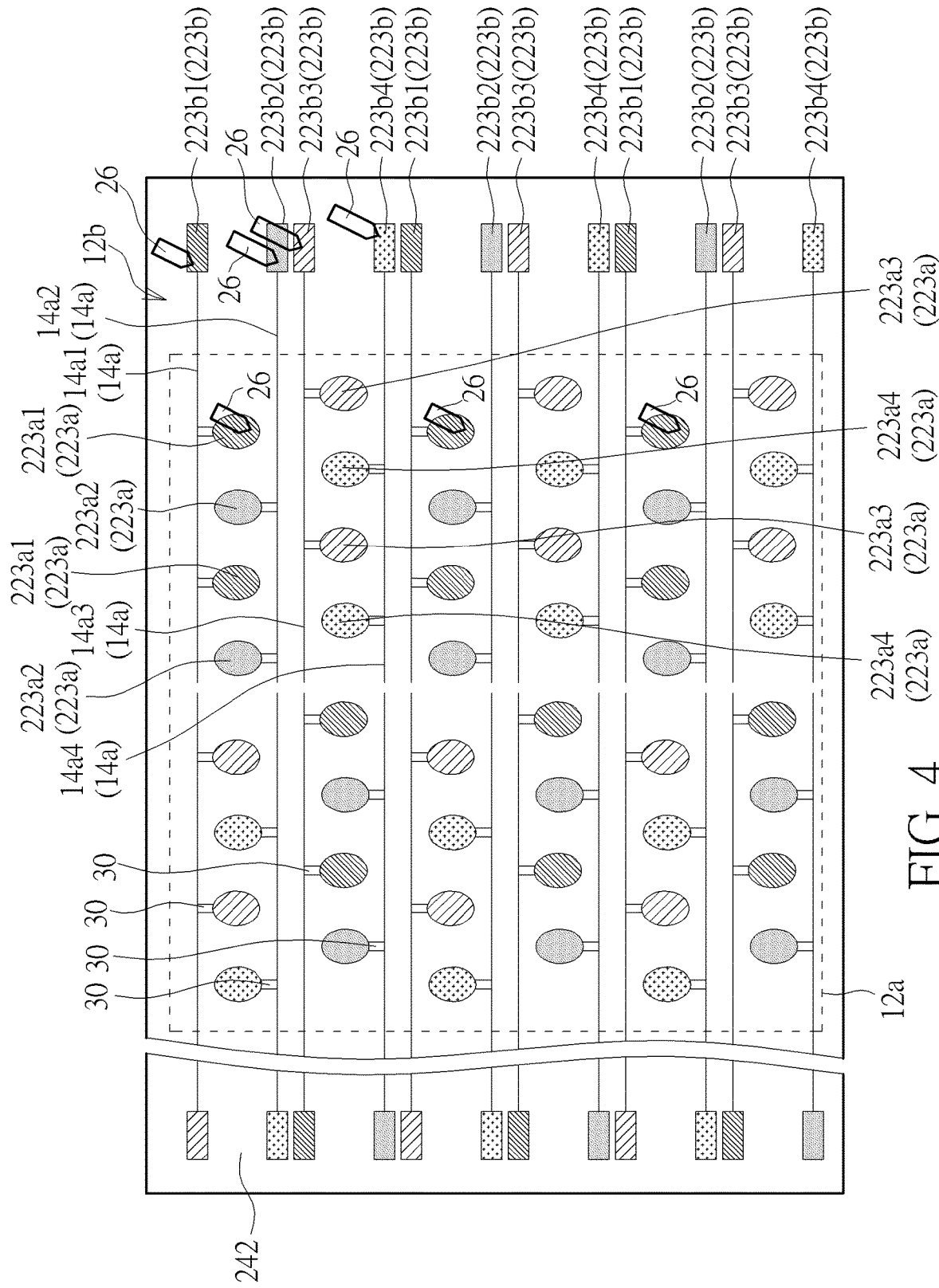
FIG. 4 is an enlarged schematic diagram of inspection lines and pads corresponding to a single device region of FIG. 3.

The inspection steps of the present disclosure will be further described in the followings. FIG. 3 is a schematic top view of a package device before a cutting process is performed according to one embodiment of the present disclosure. FIG. 4 is an enlarged schematic diagram of the inspection lines and the pads corresponding to a single device region of FIG. 3. For clarity, the components in the device region 12a are omitted in FIG. 3, and not limited thereto. As shown in FIG. 3, the carrier substrate 12 may have a plurality of device regions 12a, and the inspection lines 14a may extend from different device regions 12a to the peripheral region 12b for electrically connecting different pads in the different device regions 12a to the corresponding pads in the peripheral region 12b, thereby the circuits in the different device regions 12a may be inspected through the exposed pads. The pads 223b shown in FIG. 3 are taken as the pads 223b of the uppermost second conductive layer located in the peripheral region 12b shown in FIG. 1, for example, but not limited thereto. In some embodiments, the pads 223b in the peripheral region 12b shown in FIG. 3 may also be the pads of any layer of the second conductive layers or the pads of the first conductive layer, but not limited thereto.

In the embodiment of FIG. 3, the pads 223b in the peripheral region 12b for inspecting the circuits in the same device region 12a may be divided into a plurality of inspection groups, so that different circuits in the same device region 12a may be inspected at the same time or in batches through different pads 223b. In the embodiment of FIG. 3, the pads 223b in the same device region 12a are divided into, for example, a pad 223b1 of a first inspection group, a pad 223b2 of a second inspection group, a pad 223b3 of a third inspection group, and a pad 223b4 of a fourth inspection group, but not limited thereto. The number of the pads 223b corresponding to at least one of the inspection groups of the same device region 12a may not be limited to one shown in FIG. 3, and may also be adjusted to multiple according to requirements. In some embodiments, the number of the inspection groups divided from the pads 223b in at least two different device regions 12a may also be different from each other, but not limited thereto.

As shown in FIG. 3, for the same device region 12a, according to the number of the inspection groups divided from the pads 223b, the inspection lines 14a may be divided into inspection lines corresponding to different inspection groups. For example, the inspection lines 14a may be divided into a first inspection line 14a1 as being electrically connected to the pad 223b1 of the first inspection group, a second inspection line 14a2 as being electrically connected to the pad 223b2 of the second inspection group, a third inspection line 14a3 as being electrically connected to the pad 223b3 of the third inspection group, and a fourth inspection line 14a4 as being electrically connected to the pad 223b4 of the fourth inspection group. The numbers of the first inspection line 14a1, the second inspection line 14a2, the third inspection line 14a3, and the fourth inspection line 14a4 are not limited to those shown in FIG. 3, and may be adjusted according to requirements.

FIG. 4 further shows the connection relationship between the pads and the inspection lines 14a in the single device region 12a, but the positions and the structures of the pads and the inspection lines 14a in the device region 12a of the present disclosure are not limited to those shown in FIG. 4, and may be adjusted according to design requirements. The pads in the device region 12a and the pads in the peripheral region 12b shown in FIG. 4 are respectively, for example, the pads 223a and the pads 223b formed of the uppermost second conductive layer 223 shown in FIG. 1. The following inspection steps will be described with reference to FIG. 4, but not limited thereto. As shown in FIG. 1 and FIG. 4, the pads 223a of the second conductive layer 223 in the device region 12a may be divided into a plurality of pad groups which are electrically isolated from each other, and the pads 223b in the peripheral region 12b for inspection may be electrically connected to the corresponding pad groups respectively through the first conductive layer 14. In the embodiment of FIG. 4, the pads 223a in the device region 12a may be divided into a first pad group, a second pad group, a third pad group, and a fourth pad group that are electrically isolated from each other. The pads 223a1 of the first pad group may be electrically connected to the pad 223b1 of the first inspection group through the corresponding first inspection line 14a1, and the pads 223a2 of the second pad group may be electrically connected to the pad 223b2 of the second inspection group through the corresponding second inspection line 14a2, the pads 223a3 of the third pad group may be electrically connected to the pad 223b3 of the third inspection group through the corresponding third inspection line 14a3, and the pads 223a4 of the fourth pad group may be electrically connected to the pad 223b4 of the fourth inspection group through the corresponding fourth inspection line 14a4.

In the same pad group, the number of the pads 223a electrically connected to the same pad 223b in the peripheral region 12b may be at least one, in other words, at least one inspection line 14a may be electrically connected to at least one pad 223a in the device region 12a. For example, in the embodiment of FIG. 4, the number of the pads 223a1 electrically connected to the same pad 223b1 may be two, but not limited thereto. In some embodiments, the adjacent pads 223a in the device region 12a (for example, the pad 223a1 and the pad 223a2, or the pad 223a3 and the pad 223a4) may be electrically connected to different inspection lines 14a (for example, the first inspection line 14a1 and the second inspection line 14a2) respectively. Therefore, the isolation between the adjacent pads 223a in the device region 12a may be inspected through different pads 223b (for example, the pad 223b1 and the pad 223b2). In addition, in the embodiment of FIG. 4, the numbers of the pads 223b1 of the first inspection group, the pads 223b2 of the second inspection group, the pads 223b3 of the third inspection group, and the pads 223b4 of the fourth inspection group may be respectively multiple, but not limited thereto. In this case, the pads 223b of the same inspection group may be electrically connected to or electrically isolated from each other.

As shown in FIG. 4, forming the redistribution layer 20 may further includes forming a plurality of lines 30, and the pads 223a in the device region 12a may be electrically connected to the corresponding inspection lines 14a through corresponding lines 30, respectively. The line 30 may be defined as a line electrically connected between one of the pads in the device area 12a and the corresponding inspection line 14a, for example, the line 30 may include traces and other pads in the second conductive layer which have been formed before the inspection step is performed and are electrically connected between the corresponding pad 223a and the corresponding inspection line 14a. The line 30 may include, for example, one of the pads 222a of the second conductive layer 222 and its corresponding trace, one of the conductive pillars 221a of the second conductive layer 221, and the corresponding contact structure 18a as shown in FIG. 1, but not limited thereto. In the embodiment of FIG. 4, two different lines 30 corresponding to different two pad groups may be electrically isolated from each other, but not limited thereto. In some embodiments, at least two lines 30 may also be electrically connected to each other according to inspection requirements or line design requirements.

As shown in FIG. 4, in the inspection step of one embodiment, two input/output terminals 26 may be used to provide the input signal to one of one of the pads 223b1 of the first inspection group and the corresponding pad 223a1 in the device region 12a, and to receive the output signal from another of the pad 223b1 of the first inspection group and the corresponding pad 223a1 in the device region 12a, thereby determining whether the line connected between the pad 223b1 of the first inspection group and the pad 223a1 is conductive. In some embodiments, when the input signal is provided to one of the pads 223a and the pads 223b, the inspection step may also include receiving an output signal and another output signal from at least two pads 223a or at least two corresponding pads 223b, respectively. Specifically, while receiving the output signal, the inspection step may optionally include using another input/output terminal 26 to receive the another output signal from the pad 223a (for example, the pad 223a2) adjacent to the pad 223a1 and/or its line 30, or from the pad 223b (for example, the pad 223b2) electrically connected thereto. For example, when the pad 223a2 or the corresponding line 30 is adjacent to the pad 223a1 or the line 30 corresponding to the pad 223a1, the another output signal may be received through the pad 223a2 or the pad 223b2. Since no input signal is provided to the pad 223a2 or the pad 223b2 at this time, through the another output signal, it may be determined whether the pad 223a1 and the pad 223a2 have a short circuit. In some embodiments, while receiving the output signal, the inspection step may also include, for example, using other input/output terminals 26 to receive other output signals from the pad 223a3 or the pad 223b3 and/or from the pad 223a4 or the pad 223b4. In some embodiments, since the first conductive layer (for example the first conductive layer 14 shown in FIG. 1) used to form the inspection lines 14a may include passive components, in the inspection step, the received output signal may be used to determine whether it is normal based on the circuit formed of the lines 30 and the passive components.

After inspecting the line 30 between the pad 223b1 of the first inspection group and the pad 223a1 of the first pad group, the input/output terminals 26 may be used to sequentially inspect the line 30 between the pads 223b2 of the second inspection group and the pads 223a2 of the second pad group, the line 30 between the pads 223b3 of the third inspection group and the pads 223a3 of the third pad group, and the line 30 between the pads 223b4 of the fourth inspection group and the pads 223a4 of the fourth pad group in a similar manner. The inspection sequence for the line 30 between the pad 223b1 of the first inspection group and the pad 223a1 of the first pad group, the line 30 between the pad 223b2 of the second inspection group and the pad 223a2 of the second pad group, the line 30 between the pad 223b3 of the three inspection group and the pad 223a3 of the third pad group, and the line 30 between the pad 223b4 of the fourth inspection group and the pad 223a4 of the fourth pad group is not limited to their arrangement order, it may be adjusted according to the actual configuration relationships or the requirements. In some embodiments, the inspection step may also include simultaneously inspecting the lines 30 of different inspection groups. In some embodiments, the configurations of the lines 30 of different inspection groups may be the same or different, but not limited thereto.

In some embodiments, when there are multiple pads 223b in the same inspection group, the lines 30 between at least two of the pads 223b of the same inspection group and the corresponding pads 223a in the device region 12a may be inspected at the same time. For example, in one inspection step, a plurality of input/output terminals 26 may be used to provide at least two input signals to at least two pads 223b1 of the first inspection group, and to receive output signals from two of the corresponding pads 223a1 in the device region 12a, but not limited thereto. In some embodiments, the input signals may include, for example, a low-frequency signal, a high-frequency signal, or a combination thereof, but not limited thereto. When inspecting at least two lines 30 that are isolated from each other, the input signals transmitted to the at least two lines 30 may be, for example, the low-frequency signal and the high-frequency signal, respectively. In some embodiments, the pads 223a in the device region 12a and the pads 223b in the peripheral region 12b shown in FIG. 4 may also apply to the pads formed of any conductive layer shown in FIG. 2.

It is noted that through the above-mentioned manufacturing methods of package devices, the inspection steps may be performed in real time on the second conductive layers formed in different steps, so that the components of the package devices may be inspected out the defects in real time during the manufacturing processes without waiting for the inspection after the chips are bonded thereon. Alternatively, the components of the package devices may be repaired before the package devices are completed, thereby reducing the manufacturing cost.

The manufacturing methods of the package devices are not limited to the above-mentioned embodiments, and different embodiments may be implemented. To simplify the description, different embodiments in the followings will use the same reference numerals as those in some embodiments to denote the same components. In order to clearly describe the different embodiments, the followings will describe the differences between the different embodiments, and the repeated portions will not be described again.

Figure 5:
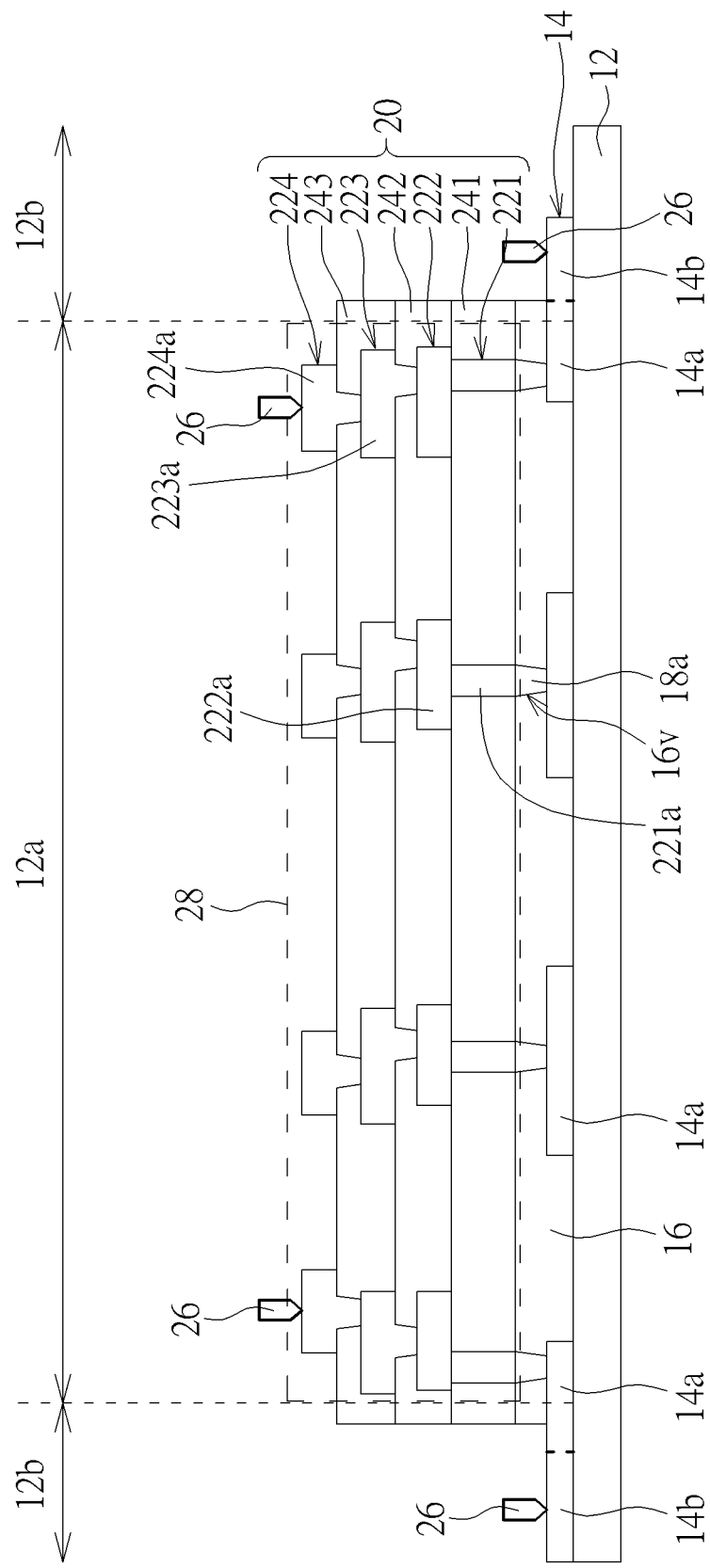
FIG. 5 is a schematic diagram illustrating a manufacturing method of a package device according to some embodiments of the present disclosure.

FIG. 5 is a schematic diagram illustrating a manufacturing method of a package device according to some embodiments of the present disclosure. In the manufacturing method of this embodiment, in addition to the inspection lines 14a, the first conductive layer 14 may further include at least one pad 14b disposed in the peripheral region 12b, and the pad 14b may be electrically connected to the inspection line 14a. Moreover, the release layer 16 and the redistribution layer 20 may not be formed on the pad 14b, so that the pad 14b is exposed. Therefore, the input/output terminal 26 may be used to provide input signals to or receive output signals from the pad 14b during the inspection step. The other portions of the manufacturing method of this embodiment may be the same as or similar to the above-mentioned embodiments. Therefore, the same portions may refer to the description of the above-mentioned embodiments, and will not be repeated. In some embodiments, the redistribution layer 20 may not be formed in the peripheral region 12b, so that the second conductive layer 221, the second conductive layer 222, the second conductive layer 223, and the second conductive layer 224 may have no pad in the peripheral region 12b. In some embodiments, the pads of the first inspection group, the pads of the second inspection group, the pads of the third inspection group, and the pads of the fourth inspection group shown in FIG. 3 and FIG. 4 may respectively include the pad 14b formed of the first conductive layer 14 of FIG. 5.

Figure 6:
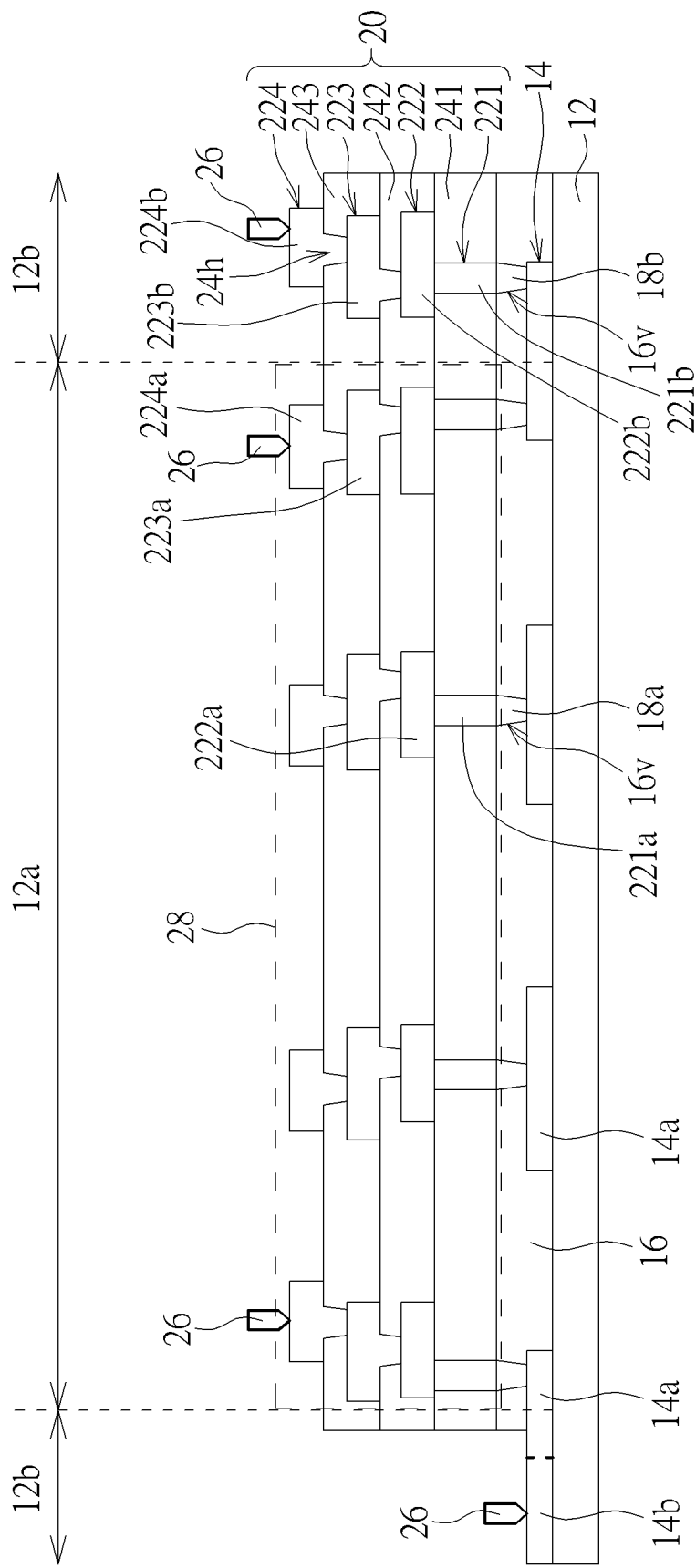
FIG. 6 is a schematic diagram illustrating a manufacturing method of a package device according to some embodiments of the present disclosure.

FIG. 6 is a schematic diagram illustrating a manufacturing method of a package device according to some embodiments of the present disclosure. In the manufacturing method of this embodiment, when the second conductive layer (for example, the second conductive layer 224) includes pads (for example, the pads 224b) in the peripheral region 12b, the first conductive layer 14 may also include at least one pad 14b disposed in the peripheral region 12b, and the pad 14b may be electrically connected to the inspection line 14a.

In this embodiment, the release layer 16 and the redistribution layer 20 may not be formed on the pad 14b, so that the pad 14b is exposed. Therefore, one of the input/output terminals 26 may be used to provide the input signal to or receive the output signal from the pad 14b during the inspection step. The other portions of the manufacturing method of this embodiment may be the same as or similar to those of the above-mentioned embodiments, so the same portions may refer to the description of the above-mentioned embodiments, and will not be repeated. In some embodiments, the pads of the first inspection group, the pads of the second inspection group, the pads of the third inspection group, and the pads of the fourth inspection group shown in FIG. 3 and FIG. 4 may respectively include the pad 14b formed of the first conductive layer 14 of FIG. 6.

Figure 7:
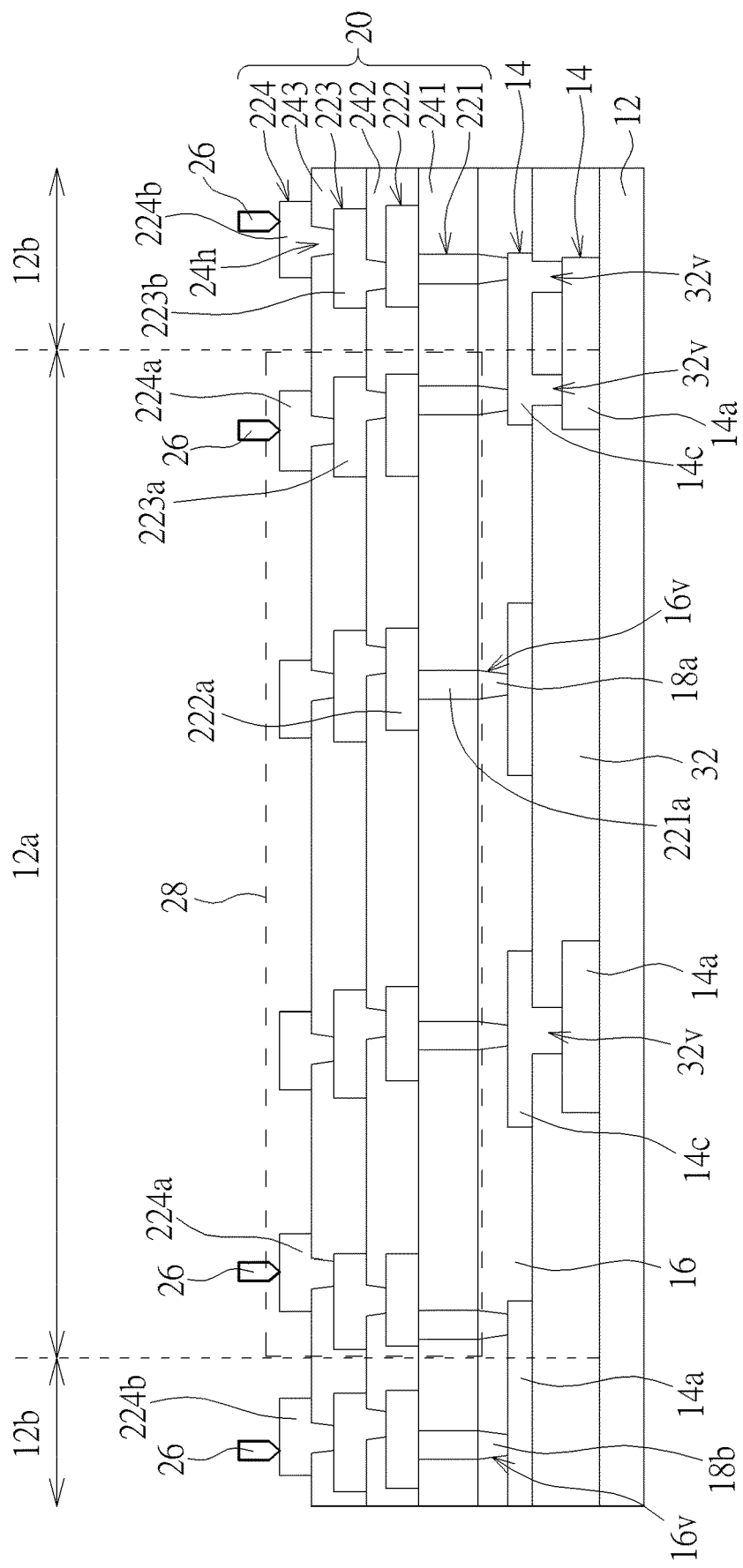
FIG. 7 is a schematic diagram illustrating a manufacturing method of a package device according to some embodiments of the present disclosure.

FIG. 7 is a schematic diagram illustrating a manufacturing method of a package device according to some embodiments of the present disclosure. As shown in FIG. 7, in the manufacturing method of this embodiment, before the release layer 16 is formed, at least two first conductive layers 14 and at least one insulating layer 32 may be provided, and the insulating layer 32 may be disposed between the at least two first conductive layers 14. In an example of forming two first conductive layers 14, after the carrier substrate 12 is provided, one of the first conductive layers 14 is firstly formed on the carrier substrate 12, and then the insulating layer 32 may be formed on the one of the first conductive layers 14 and the carrier substrate 12, and a plurality of through holes 32v may be formed in the insulating layer 32. Thereafter, another of the first conductive layers 14 may be formed on the insulating layer 32. In this embodiment, each of the first conductive layers 14 may include inspection lines 14a for electrically connecting the pads of the second conductive layers in the device region 12a to the pads of the second conductive layers in the peripheral region 12b. Taking the second conductive layer 224 as an example, the inspection line 14a may electrically connect the pad 224a of the second conductive layer 224 to the pad 224b of the second conductive layer 224. In the embodiment of FIG. 7, the first conductive layer 14 formed on the insulating layer 32 may further include a connection pad 14c that extends into the through holes 32v of the insulating layer 32, thereby electrically connecting the inspection lines 14a of the first conductive layer 14 between the insulating layer 32 and the carrier substrate 12 to the redistribution layer 20. It should be noted that the inspection lines 14a of different first conductive layers 14 may be electrically isolated from each other, so that different pads of the second conductive layers in the device region 12a (for example, the pads 224a) may be electrically connected to different pads in the peripheral region 12b (for example, the pads 224b), respectively, through the inspection lines 14a of different first conductive layers 14. Through the design of the multi-layered first conductive layer 14, the manners for electrically connecting the pads in the device region 12a to the pads in the peripheral region 12b may be increased, thereby increasing the number of pad groups and the number of pads for inspection in the peripheral region 12b. In other words, compared with the embodiment of FIG. 2, the pads in the device region 12a may be divided into more groups in the design of this embodiment, thereby increasing the manners of inspecting circuits, or simultaneously performing inspection on more pad groups to improve inspection efficiency. In some embodiments, the first conductive layer 14 shown in FIG. 5 or FIG. 6 may also be applied to at least one of the first conductive layers 14 shown in FIG. 7, so that the first conductive layer 14 may have exposed pad 14b. In this case, the pads of the first inspection group, the pads of the second inspection group, the pads of the third inspection group, and the pads of the fourth inspection group shown in FIG. 3 and FIG. 4 may include the pads formed of one of the first conductive layers 14, or the pads formed of two first conductive layers 14 shown in FIG. 7. In some embodiments, the inspection lines shown in FIG. 3 and FIG. 4 may include the inspection lines 14a of one of the first conductive layers 14, or the inspection lines 14a of two first conductive layers 14 shown in FIG. 7. The other portions of the manufacturing method of this embodiment may be the same as or similar to those of the above-mentioned embodiments, so the same portions may refer to the description of the above-mentioned embodiments and will not be repeated.

Figure 8:
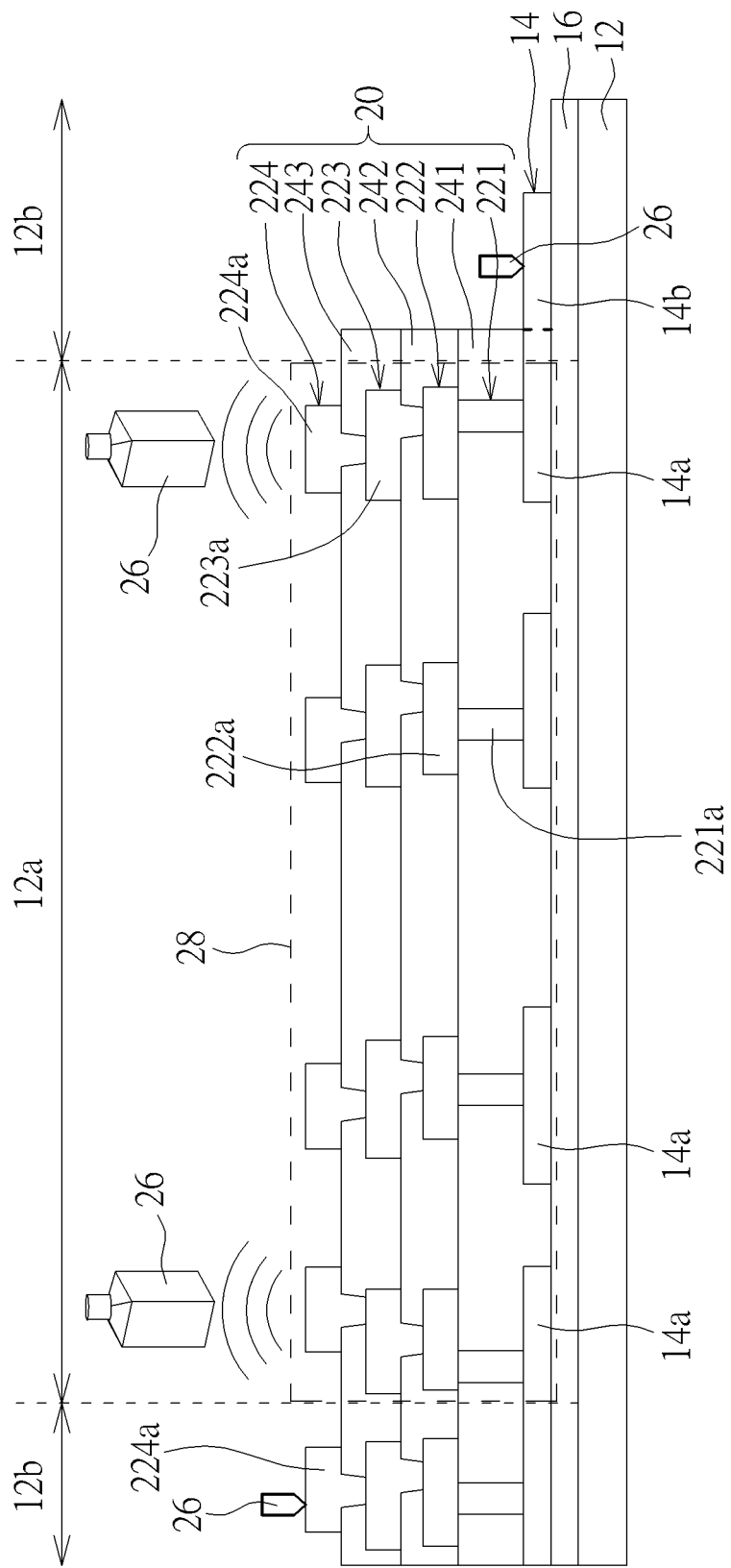
FIG. 8 is a schematic diagram illustrating a manufacturing method of a package device according to some embodiments of the present disclosure.

FIG. 8 is a schematic diagram illustrating a manufacturing method of a package device according to some embodiments of the present disclosure. As shown in FIG. 8, in the manufacturing method of this embodiment, after the release layer 16 is formed, the first conductive layer 14 may be formed on the release layer 16, so that the release layer 16 is disposed between the first conductive layer 14 and the carrier substrate 12. For example, the first conductive layer 14 may be a seed layer used to assist the formation of the second conductive layer 221. In the embodiment of FIG. 8, the second conductive layer (for example, the second conductive layer 224) may also include a pad (for example, the pad 224a) in the peripheral region 12b, and the first conductive layer 14 may also include at least one pad 14b disposed in the peripheral region 12b, and the pad 14b may be electrically connected to the inspection line 14a. In this embodiment, the release layer 16 and the redistribution layer 20 may not be formed on the pad 14b, so that the pad 14b is exposed. Therefore, one of the input/output terminals 26 may provide the input signal to or receive the output signal from the pad 14b during the inspection step. In some embodiments, the redistribution layer 20 may not be formed in the peripheral region 12b, so that the second conductive layers may have no pad in the peripheral region 12b. In some embodiments, the first conductive layer 14 of FIG. 8 may not have exposed pad 14b. In some embodiments, the pads of the first inspection group, the pads of the second inspection group, the pads of the third inspection group, and the pads of the fourth inspection group shown in FIG. 3 and FIG. 4 may also include the pad 14b formed of the first conductive layer 14 of FIG. 8. In some embodiments, the inspection lines shown in FIG. 3 and FIG. 4 may include the inspection lines 14a of the first conductive layer 14 of FIG. 8. In some embodiments, the input/output terminals 26 for receiving the output signals may include a contact-type detector, such as a probe. In some embodiments, the input/output terminals 26 for receiving the output signals may include a noncontact-type detector, such as an electric field sensor. The other portions of the manufacturing method of this embodiment may be the same as or similar to those of the above-mentioned embodiments, so the same portions may refer to the description of the above-mentioned embodiments and will not be repeated.

Figure 9:
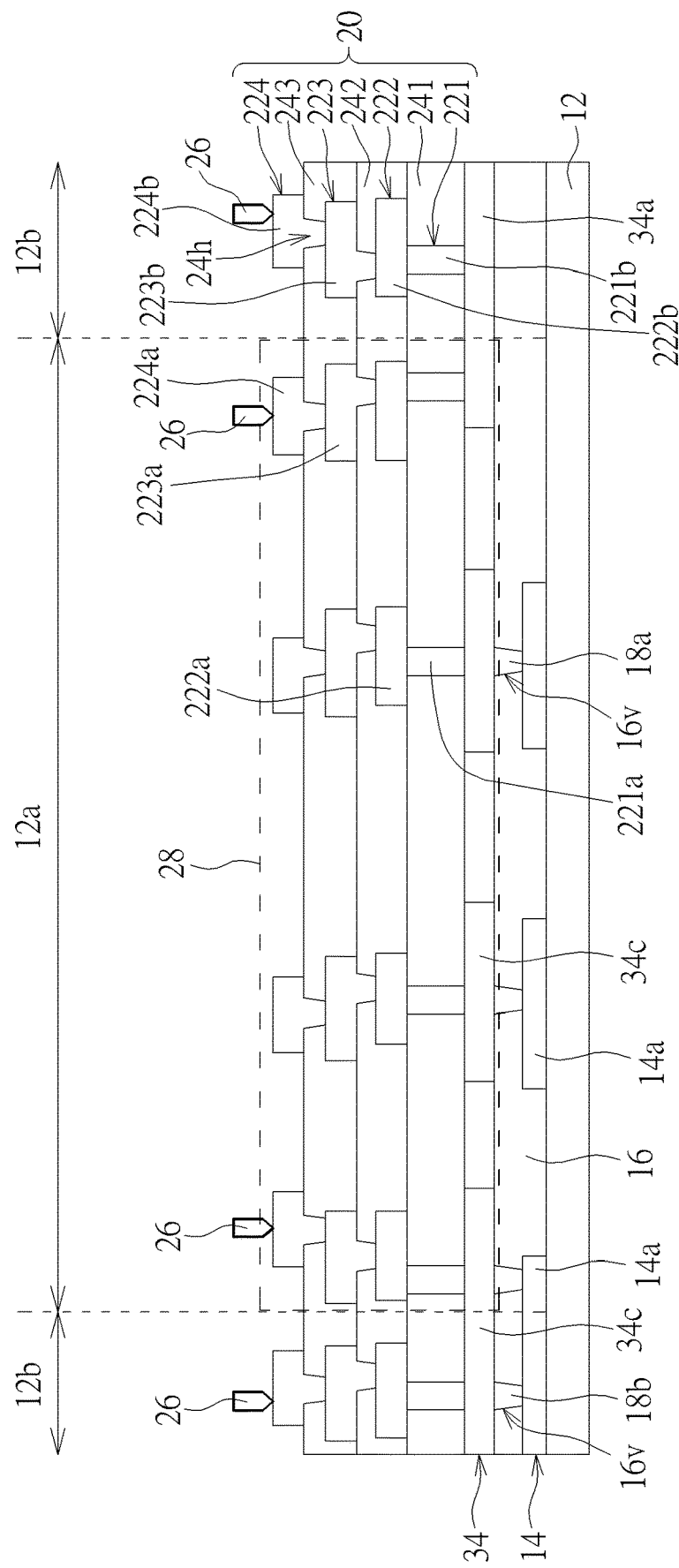
FIG. 9 is a schematic diagram illustrating a manufacturing method of a package device according to some embodiments of the present disclosure.

FIG. 9 is a schematic diagram illustrating a manufacturing method of a package device according to some embodiments of the present disclosure. As shown in FIG. 9, the manufacturing method of this embodiment may further include forming a third conductive layer 34 on the release layer 16, and the third conductive layer 34 may be formed between the release layer 16 and the second conductive layer 221. The third conductive layer 34 may include silver, copper, aluminum, molybdenum, tungsten, gold, chromium, nickel, platinum, titanium, iridium, rhodium, indium, bismuth, alloys thereof, combinations thereof, or other metal materials with good conductivity, but not limited thereto. For example, the third conductive layer 34 may be a seed layer used to form the second conductive layer 221. In the embodiment of FIG. 9, the third conductive layer 34 may also include an inspection line 34a for electrically connecting at least one of the pads of the second conductive layer in the device region 12a to at least one of the pads of the second conductive layer in the peripheral region 12b. Taking the second conductive layer 224 as an example, the pad 224a of the second conductive layer 224 may be electrically connected to the pad 224b of the second conductive layer 224 through the inspection line 34a.

As shown in FIG. 9, in some embodiments, the third conductive layer 34 may further include a plurality of connection pads 34c, and the first conductive layer 14 is electrically connected to the second conductive layers through the plurality of connection pads 34c. Specifically, the connection pads 34c may electrically connect the inspection lines 14a of the first conductive layer 14 to the redistribution layer 20 through the contact structures 18a and the contact structure 18b. It should be noted that the inspection line 14a of the first conductive layer 14 and the inspection line 34a of the third conductive layer 34 may be electrically isolated from each other, so that the different pads (such as the pads 224a) of the second conductive layers in the device region 12a may be electrically connected to the different pads (for example, the pads 224b) of the second conductive layers in the peripheral region 12b through the inspection line 14a of the first conductive layer 14 and the inspection line 34a of the third conductive layer 34, respectively. Through the first conductive layer 14 and the third conductive layer 34, the manners of electrically connecting the pads in the device region 12a to the pads in the peripheral region 12b may be increased, thereby increasing the number of pad groups and the number of pads used for inspection in the peripheral region 12b. In other words, compared with the embodiment of FIG. 2, the pads in the device region 12a may be divided into more groups in this embodiment, thereby increasing the manners of inspecting circuits, or simultaneously inspecting more pad groups to improve inspection efficiency. In some embodiments, before the release layer 16 is formed, multiple first conductive layers 14 and at least one insulating layer 32 may be formed.

In some embodiments, the first conductive layer 14 shown in FIG. 5 or FIG. 6 may also be applied to the first conductive layer 14 and/or the third conductive layer 34 shown in FIG. 9, so that the first conductive layer 14 and/or the third conductive layer 34 may have exposed pad. In this case, the pads of the first inspection group, the pads of the second inspection group, the pads of the third inspection group, and the pads of the fourth inspection group shown in FIG. 3 and FIG. 4 may include the pads of the first conductive layer 14, the pads of the third conductive layer 34 of FIG. 9, or a combination thereof. In some embodiments, the inspection lines shown in FIG. 3 and FIG. 4 may include the inspection lines 14a of the first conductive layer 14, the inspection line 34a of the third conductive layer 34 of FIG. 9, or a combination thereof. The other portions of the manufacturing method of this embodiment may be the same as or similar to those of the above-mentioned embodiments, so the same portions may refer to the description of the above-mentioned embodiments and will not be repeated.

In summary, through the above-mentioned manufacturing methods of package devices, the inspection steps may be performed in real time on the second conductive layers formed in different steps, so that the components of the package devices are inspected out the defects in real time during the manufacturing processes without waiting for the inspection after the chips are bonded, or the components of the package devices may be repaired before the package devices are completed to reduce the manufacturing cost. In addition, through forming the additional first conductive layer and/or third conductive layer between the redistribution layer and the carrier substrate, it may help to divide the pads in the device region into more groups, thereby increasing the manners of inspecting circuits, or simultaneously inspecting more pad groups to improve the inspection efficiency.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a redistribution layer, comprising:
      a first insulating layer;
      a second insulating layer; and
      a plurality of traces electrically connected to each other through a first opening of the first insulating layer and a second opening of the second insulating layer, wherein the first insulating layer has a first side away from the second insulating layer, and the second insulating layer has a second side away from the first insulating layer;
   a plurality of passive components, disposed on the first side; and
   an electronic component, disposed on the second side,
   wherein the plurality of passive components are electrically connected to the electronic component through the plurality of traces, one of the plurality of traces is a bonding pad, the electronic component is electrically connected to the redistribution layer through the bonding pad, a portion of the bonding pad contacts with the second side of the second insulating layer, another portion of the bonding pad is disposed in the second opening of the second insulating layer, and a width of the portion of the bonding pad is greater than a width of the another portion of the bonding pad.

2. The electronic device according to claim 1, wherein the plurality of passive components are integrated into an integrated passive device.

3. The electronic device according to claim 1, wherein the plurality of passive components comprise a capacitor, an inductor or a resistor.

4. The electronic device according to claim 1, wherein a thickness of the first insulating layer is greater than a thickness of the second insulating layer.

5. The electronic device according to claim 1, wherein a thickness of the portion of the bonding pad is greater than a depth of the second opening of the second insulating layer.

6. The electronic device according to claim 1, wherein in a top view of the electronic device, the first opening does not overlap the second opening.

\* \* \* \* \*